(12) United States Patent
Ng et al.

(10) Patent No.: US 9,882,094 B2
(45) Date of Patent: Jan. 30, 2018

(54) LIGHT SOURCE WITH INNER AND OUTER BODIES COMPRISING THREE DIFFERENT ENCAPSULANTS

(75) Inventors: Keat Chuan Ng, Penang (MY); Norfidathul Aizar Abdul Karim, Penang (MY); Chiau Jin Lee, Penang (MY)

(73) Assignee: INTELLECTUAL DISCOVERY CO., LTD., Seoul (KR)

(*) Notice: Subject to any disclaimer, the term of this patent is extended or adjusted under 35 U.S.C. 154(b) by 703 days.

(21) Appl. No.: 13/047,293

(22) Filed: Mar. 14, 2011

(65) Prior Publication Data
US 2012/0235187 A1    Sep. 20, 2012

(51) Int. Cl.
| | |
|---|---|
| *H01L 33/48* | (2010.01) |
| *H01L 33/60* | (2010.01) |
| *H01L 33/62* | (2010.01) |
| *G09F 9/33* | (2006.01) |
| *H01L 25/075* | (2006.01) |

(52) U.S. Cl.
CPC .............. *H01L 33/486* (2013.01); *G09F 9/33* (2013.01); *H01L 33/60* (2013.01); *H01L 25/0753* (2013.01); *H01L 33/62* (2013.01); *H01L 2224/48247* (2013.01); *H01L 2933/0033* (2013.01)

(58) Field of Classification Search
CPC ....... H01L 33/486; H01L 33/60; H01L 33/62; H01L 2933/0033; H01L 2224/48247

USPC .................... 257/98, 100, E33.059, E33.068
See application file for complete search history.

(56) References Cited

U.S. PATENT DOCUMENTS

| | | | |
|---|---|---|---|
| 7,053,416 B2 | 5/2006 | Yasuoka | |
| 7,385,227 B2* | 6/2008 | Mok et al. | 257/98 |
| 7,736,070 B2 | 6/2010 | Ho et al. | |
| 8,188,497 B2* | 5/2012 | Noma | 257/98 |
| 2010/0264437 A1 | 10/2010 | Loo et al. | |

FOREIGN PATENT DOCUMENTS

| | | |
|---|---|---|
| CN | 101853914 | 10/2010 |
| KR | 2009/0032866 | 4/2009 |

* cited by examiner

*Primary Examiner* — Marcos D Pizarro
(74) *Attorney, Agent, or Firm* — Sughrue Mion, PLLC

(57) ABSTRACT

A light-emitting device having an inner reflective body and an outer non-reflective body is disclosed. The inner reflective body defines a reflector configured to reflect light. In one embodiment, the outer non-reflective body encloses the inner reflective body to minimize reflectivity of the light-emitting device. When assembled into an infotainment display system, the outer non-reflective body may be configured to reduce reflection of ambient light and hence, increase contrast ratio of the display. Reliability performance of the light-emitting device may be improved by using interlocking aperture at the lead frame, interlock structure and interlock geometries defined by the inner reflective body and the outer non-reflective body.

20 Claims, 8 Drawing Sheets

LIGHT SOURCE WITH INNER AND OUTER BODIES COMPRISING THREE DIFFERENT ENCAPSULANTS

BACKGROUND

Light-emitting diodes (referred to hereinafter as LEDs) represent one of the most popular light-emitting devices today. Due to the small form factor, LEDs are widely used in electronic infotainment display systems. Electronic infotainment display systems are usually large-scale display systems, which may be found in stadiums, discotheques, electronic traffic sign displays and in infotainment boards along streets. Electronic infotainment display may be configured to display text, graphics, images or videos containing information or entertainment contents. Most of these electronic infotainment display systems are placed outdoors and thus require high reliability specifications, such as wider operating temperature, resistance to moisture, and longer life. The electronic infotainment display systems used for displaying traffic information outdoors may be required to function in inclement conditions, such as rain, snow, or hot weather—as high as 60 degree Celsius in certain desert locations. Therefore, LEDs used in infotainment display systems may require very high or stringent reliability performance. For many such outdoor electronic system applications, silicone potting is commonly utilized to protect the electronic components from the elements. Silicone potting is placed in a process in which all the electronics devices on the display are encapsulated with a potting agent.

Most infotainment display systems comprise hundreds or thousands of LEDs, usually arranged in matrix. The LEDs in the infotainment system can be a white LED or a tri-color RGB. Each LED may represent a pixel in the infotainment display but in some occasions, a group of single colored LEDs may represent one pixel. The number of LEDs required in such infotainment display system may range from hundreds of LEDs to thousands of LEDs. The form factor and designs of LEDs may play a role in picture quality displayed by the infotainment displays systems. For example, for infotainment display systems that require high resolution, the LEDs are preferably as small as possible so that more LEDs can be placed into a limited space to represent more pixels per unit area. Another feature of LEDs affecting the infotainment display quality may be the brightness of LEDs. To be viewable from a distance, the LEDs are required to produce more lumen per unit area.

It may not be cost effective to produce an LED merely for infotainment display systems. Most infotainment display systems may have tight color and brightness binning requirements in order to ensure color and brightness uniformity of the display. The production yield may be low due to these binning requirements. Usually most LEDs produced for infotainment display system may be used in other applications that do not require tight color binning. For example, LEDs used in infotainment display system may be used in flashlights. In applications such as flashlights, high power LEDs are required but color binning may not be a strict requirement.

SUMMARY

Generally, a light-emitting device having inner and outer bodies is disclosed. In one embodiment, a light-emitting device having a plurality of leads, a light source die, an inner reflective body, an outer non-reflective body, and an encapsulant is disclosed. The inner reflective body further defines a reflector comprising an inner reflective surface and a bottom reflective surface. The outer non-reflective body may enclose the entire inner reflective body except the inner reflective surface and the bottom reflective surface. The leads may comprise interlock apertures to provide mechanical interlock between the leads, and at least one of the inner reflective body and the outer non-reflective body. Optionally, the inner reflective body and the outer non-reflective body may comprise interlock structures, as well as interlock geometries to further improve interlocking between the bodies to increase reliability.

In another embodiment, a light source packaging is disclosed. The light source packaging comprises a plurality of leads, a first encapsulant, encapsulating a first portion of the leads to form an inner reflective body, a second encapsulant encapsulating a second portion of the leads and the outer surface of the inner reflective body to form an outer non-reflective body, a light source die and an encapsulant encapsulating the light source die. The inner reflective body defines a reflector having an inner reflective surface and a bottom reflective surface. The light source die may be attached to one of the leads. The inner reflective surface and the bottom reflective surface may be encapsulated by the encapsulant.

A method of making a light-emitting device having double bodies is disclosed. The method includes steps of providing a plurality of leads interconnected to a lead frame, molding a first encapsulant to form an inner reflective body, bending the leads to define a substantially horizontal portion and a substantially vertical portion, molding a second encapsulant to form the outer non-reflective body, attaching a light source die on one of the leads, wire bonding the light source die, and encapsulating the light source die using an encapsulant.

Other aspects and advantages of the present invention will become apparent from the following detailed description, taken in conjunction with the accompanying drawings, illustrated by way of examples.

BRIEF DESCRIPTION OF THE DRAWINGS

Illustrative embodiments by way of examples, not by way of limitation, are illustrated in the drawings. Throughout the description and drawings, similar reference numbers may be used to identify similar elements.

DETAILED DESCRIPTION

Figure 1:
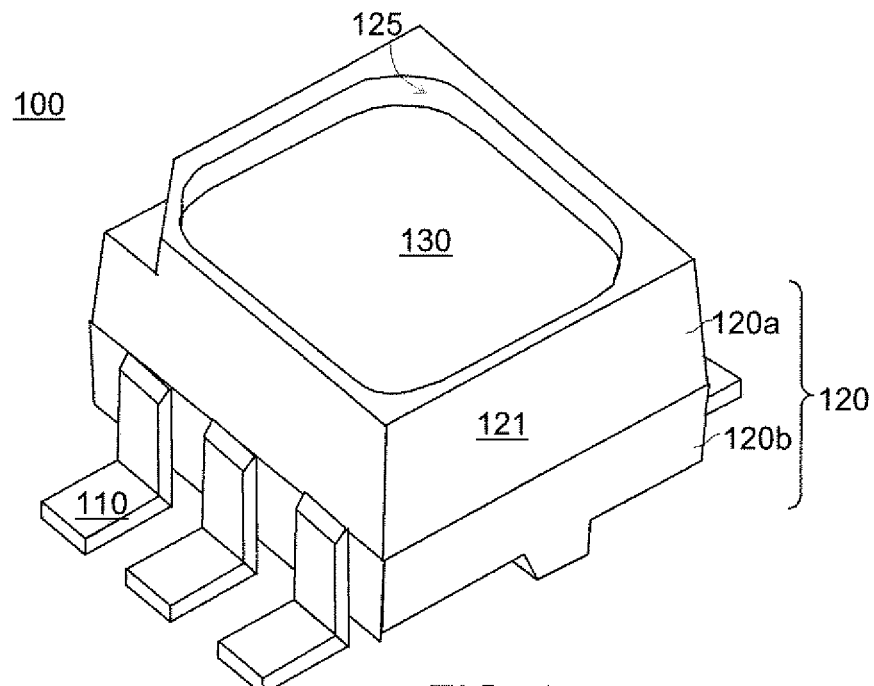
FIG. 1 illustrates a perspective view of a light-emitting device.

FIG. 1 illustrates an embodiment showing a perspective view of a light-emitting device 100. The light-emitting device 100 comprises a plurality of leads 110, a light source die (not shown), a reflective body 120, and an encapsulant 130 encapsulating the die (not shown). The body 120 comprises a top portion 120a and a bottom portion 120b. The body 120 defines a reflector 125 and an outer surface 121.

The surfaces of the body 120, including one or more of the reflector 125, the outer surface 121, the top portion 120a and the bottom portion 120b, may be made from a single material in a single top and bottom mold. Usually, the reflector 125 is required to have high reflectivity. Consequently, the other surfaces defined by the body 120 may be made from the same material with the same high reflectivity. The leads 110 may be made from metallic material that is known for high reflectivity. For some applications such as solid-state lighting, the high reflectivity may be desirable as light falling on the surfaces may be reflected to increase overall brightness of the surroundings. However, for an application such as an infotainment display system in which the performance of the display may be sensitive to form factors of the LEDs, the high reflectivity of the leads 110 and the outer surface 121 may reduce the contrast of the display. Alternative embodiments are described herein that reduce reflectivity and increase contrast.

The contrast ratio is a property of a display system, defined as the ratio of the luminance of the brightest color to that of the darkest color that the system is capable of producing. A high contrast ratio is a desired aspect of any display. Consider an example of two adjacent LEDs 100 that form a portion of an infotainment display system (not shown), having each of the LEDs representing one pixel of the display. One LED is configured to produce maximum output, $\Phi_A$ representing the brightest color, and the other LED is configured to produce no output, representing the darkest color of the display. As the other LED produces no output, the brightness perceived by a user may be equal to the ambient brightness, $\Phi_E$. Ideally, the contrast ratio may be modeled as in equation (1), wherein $\Phi_A$ represents the brightness of the brightest color whereas $\Phi_E$ represents the ambient brightness that is seen as the darkest color.

$$\text{Contrast Ratio} = \Phi_A/\Phi_E \qquad (1)$$

However, in reality the contrast ratio obtained is affected by the light reflected from the leads 110 and the body 120 of the LED 100 producing the darkest color and should be modeled as equation (2), wherein $\Phi_R$ represents brightness of light reflected by the outer surface 121 and the leads 110 of the LEDs 100 producing the darkest color.

$$\text{Contrast Ratio} = \Phi_A/(\Phi_E + \Phi_R) \qquad (2)$$

As a result, the reflected light $\Phi_R$ may inevitably reduce the contrast ratio of the infotainment display system. Increasing the brightness $\Phi_A$ of the LED 100 may not effectively increase the contrast ratio because when the brightness $\Phi_A$ increases, the light being reflected $\Phi_R$ may also increase.

Figure 2A:
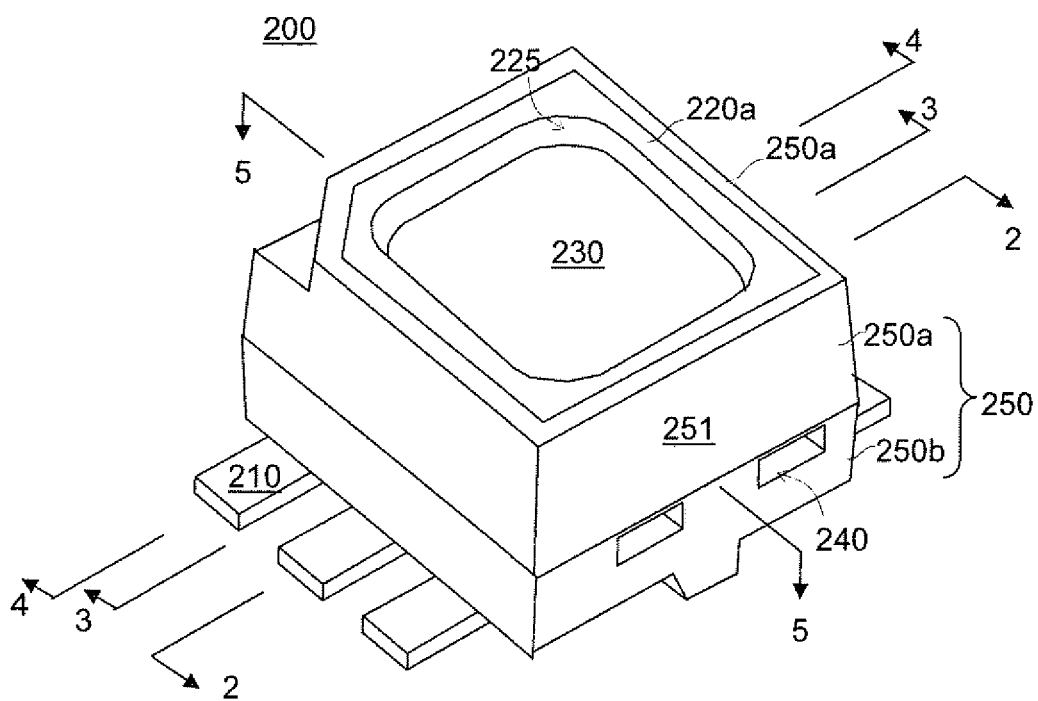
FIG. 2A illustrates a perspective view of a light-emitting device having inner and outer bodies.
Figure 2B:
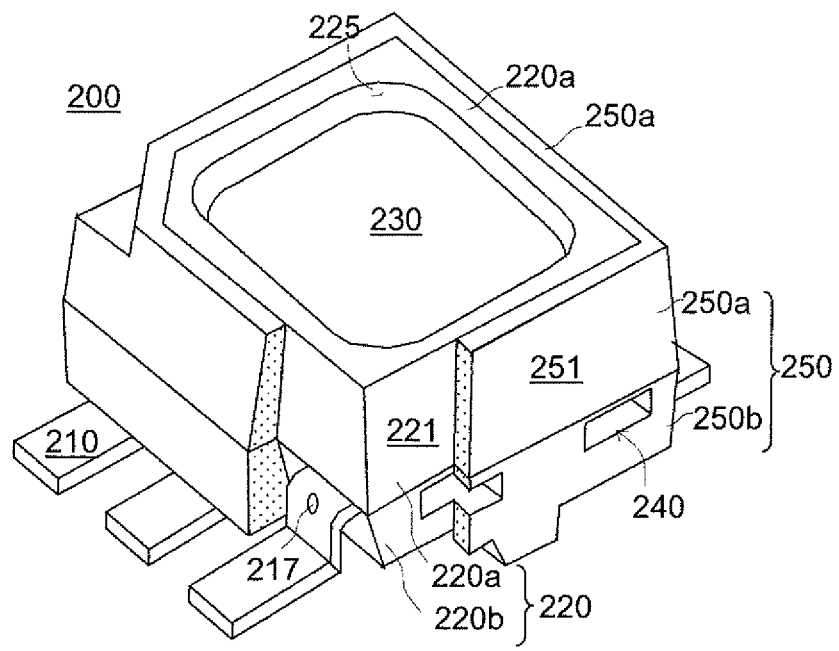
FIG. 2B illustrates a cut-away perspective view of the light-emitting device shown in FIG. 2A showing an inner reflective body.
Figure 2C:
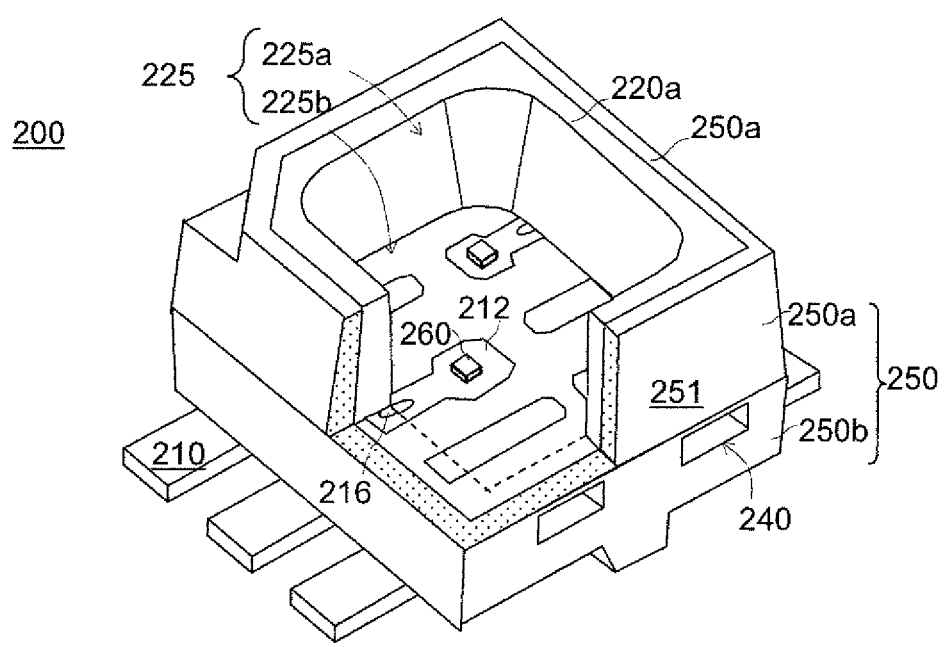
FIG. 2C illustrates a cut-away perspective view of the light-emitting device shown in FIG. 2A without encapsulant showing light source dies and a reflector.

An effective way to improve the contrast ratio is to use LEDs capable of reducing reflected light $\Phi_R$ by implementing the teachings herein. FIG. 2A illustrates an embodiment showing a perspective view of light-emitting device 200. FIG. 2B and FIG. 2C illustrate cut-away perspective views of the light-emitting device 200 showing inner portions of the light-emitting device 200. FIGS. 2D, 2E, 2F and 2H are cross-sectional views taken along lines 2-2, 3-3, 4-4 and 5-5, respectively. FIG. 2G is a cross-sectional view taken along line 6-6 shown in FIG. 2F. Referring to FIGS. 2A-2H, the light-emitting device 200 comprises a plurality of leads 210, an inner reflective body 220, an outer non-reflective body 250 and a light source die 260. In the embodiment shown in FIGS. 2A-2H, the inner reflective body 220 is made from a first encapsulant encapsulating a portion of the leads 210 whereas the outer non-reflective body 250 is made from a second encapsulant encapsulating the inner reflective body 220 and a portion of the leads 210 not encapsulated by the inner reflective body 220. The light source die 260 is encapsulated by a third encapsulation 230.

The inner reflective body 220 is preferably highly reflective whereas the outer body 250 is preferably less reflective compared to the inner body 220. However, the word "reflective" is to be construed relatively, comparing reflectivity of the inner reflective body 220 and the outer non-reflective body 250. For example, the first encapsulant may be $TiO_2$ filled polymer material like poly-phthalamide (referred to hereinafter as PPA), liquid crystal polymer (referred to hereinafter as LCP), polyamide or epoxy resin encapsulant like MG 97 or any other similar material that is highly reflective. Certain PPAs have a reflectivity of 95%. On the contrary, the outer non-reflective body 250 may be configured to absorb as much light as possible. For example, the second encapsulant may be a carbon filled polymer material, the polymer being PPA, LCP, polyamide or epoxy resin encapsulant like MG 97 or any other similar material. The outer non-reflective body 250, when constructed of such materials, may have a low reflectivity, preferably less than 50%.

The outer non-reflective body 250 defines an outer wall 251 (see FIG. 2C) surrounding the inner reflective body 220. The outer non-reflective body 250 may further define at least an optional aperture 240 configured to hold the light-emitting device 200 on a lead frame (not shown) during the manufacturing process. In yet another embodiment, the portion of the lead frame (not shown) inside the aperture 240 may be cut off leaving the metal trace inside the aperture 240 in the finished product. The third encapsulant 230 may be epoxy, silicone or any other similar materials which is usually transparent. Optionally, when the light-emitting device 200 is configured to emit white light, the third encapsulant 230 is mixed with a waveform converting material such as a yellow phosphor, a red phosphor or other similar materials. Light propagating through such third encapsulant 230 may have the wavelength converted to produce white light.

As shown in FIG. 2A, the outer non-reflective body 250 further comprises a top portion 250a and a bottom portion 250b. The top 250a and bottom 250b portions may be made from a top mold and a bottom mold, respectively. Similarly, as shown in FIG. 2B, the inner reflective body 220 comprises a top portion 220a and a bottom portion 220b made from a top mold and a bottom mold, respectively. The inner reflective body 220 further defines a reflector 225 and an outer surface 221. The outer surface 221 is encapsulated and covered by the outer wall 251 of the outer non-reflective body 250.

As shown in FIG. 2B, the aperture 240 for holding a lead frame (not shown) during the manufacturing process may extend through the outer non-reflective body 250 towards the inner reflective body 220. During the manufacturing process, before forming the outer non-reflective body 250, the leads 210 may be bent and the aperture 240 may be configured to hold the light-emitting device 200 to the lead frame (not shown). Upon completion of the manufacturing process, the lead frame (not shown) may be cut off, leaving a portion of metal traces (not shown) inside the aperture 240 defined by both the inner reflective body 220 as well as the outer non-reflective body 250. The metal (not shown) remained inside the aperture 240 may be reflective and may be covered using potting agent when the light-emitting device 200 is further assembled into an infotainment display system such as that described in FIG. 7. Alternatively, the metal (not shown) may be removed.

Figure 2D:
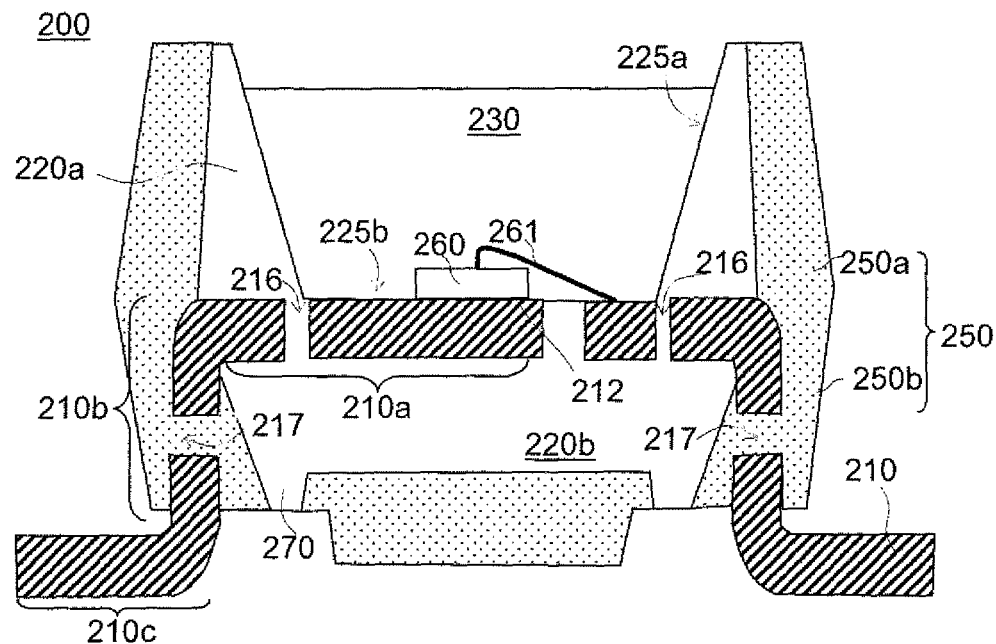
FIG. 2D illustrates a cross-sectional view of the light-emitting device shown in FIG. 2A taken along line 2-2.

FIG. 2C shows the embodiment of FIG. 2A illustrated as a cut-away perspective view of the light-emitting device 100 shown in FIG. 2A without showing the third encapsulant 230 and the wire bond 261 (See FIG. 2D). As shown in FIG. 2C, the reflector 225 further comprises an inner reflective surface 225a and a bottom reflective surface 225b. The portion of the leads 210 on the bottom reflective surface 225b may be as highly reflective as the bottom reflective surface 225b and may be considered as a part of the bottom reflective surface 225b. The reflector 225 may define a cup shape configured to direct light emitted by the light source die 260.

For high power light-emitting device such as the light-emitting device 100 used in electronic infotainment display system, high reliability performance may be desirable. Reliability performance can be improved by utilizing one or more interlocking mechanisms which provides mechanical interlock between two components, for example, between the leads 210 and the inner reflective body 220, between the leads 210 and the outer non-reflective body 250, and between the inner reflective body 220 and the outer non-reflective body 250. A mechanical interlock is formed by the geometry of two components shaped to resist the separation of two components. Examples of such interlocking mechanism are interlock apertures 216-217 shown in FIG. 2D, interlock structures 270 shown in FIG. 2D and interlock geometry shown and described in reference to FIG. 2G, which are optional and may be used individually or in combination.

As shown in the embodiment in FIG. 2C, one of the plurality of leads 210 further defines a bond pad 212 adapted to receive the light source die 260. The leads 210 may comprise an aperture configured to provide mechanical interlock between the leads 210, and the inner reflective body 220 and/or the outer non-reflective body 250. For example, the leads 210 may also comprise interlock aperture 216 configured to hold the leads 210 to the inner reflective body 220. Another interlock aperture 217 may be configured to hold the leads 210 to the outer non-reflective body 250 as shown in FIG. 2D. FIG. 2D illustrates a cross-sectional view of the light-emitting device shown in FIG. 2A taken along line 2-2. During the manufacturing process, the leads 210 may be bent at least once to define a substantially horizontal portion 210a and a substantially vertical portion 210b. For surface mount devices as shown in FIG. 2D, the leads 210 is bent at least twice to further define a bottom horizontal portion 210c. The substantially horizontal portion 210a of the lead 210 defines the bond pad 212. The substantially horizontal portion 210a of another lead 210 is adapted to receive the wire bond 261. The wire bond 261 is configured to provide electrical connection to the light source die 260. Optionally, an additional wire bond may be connecting the light source die 260 to the bond pad 212.

In FIG. 2D, the leads 210 are bent at 90 degrees. The interlock apertures 216-217 can be formed at any suitable location along the leads 210. For example, the first interlock aperture 216 may be formed at the substantially horizontal portion 210a to provide mechanical interlock between the inner reflective body 220 and the leads 210. The second interlock aperture 217 may be formed at the substantially vertical portion 210b to provide mechanical interlock between the outer non-reflective body 250 and the leads 210. However, in another embodiment, the leads 210 may not be bent at 90 degrees. Similarly, in yet another embodiment, the first interlock aperture 216 may be located at the substantially vertical portion 210b of the leads. The interlock apertures 216-217 may be formed at any location along each of the leads 210 and not confined to the examples illustrated above.

Figure 2E:
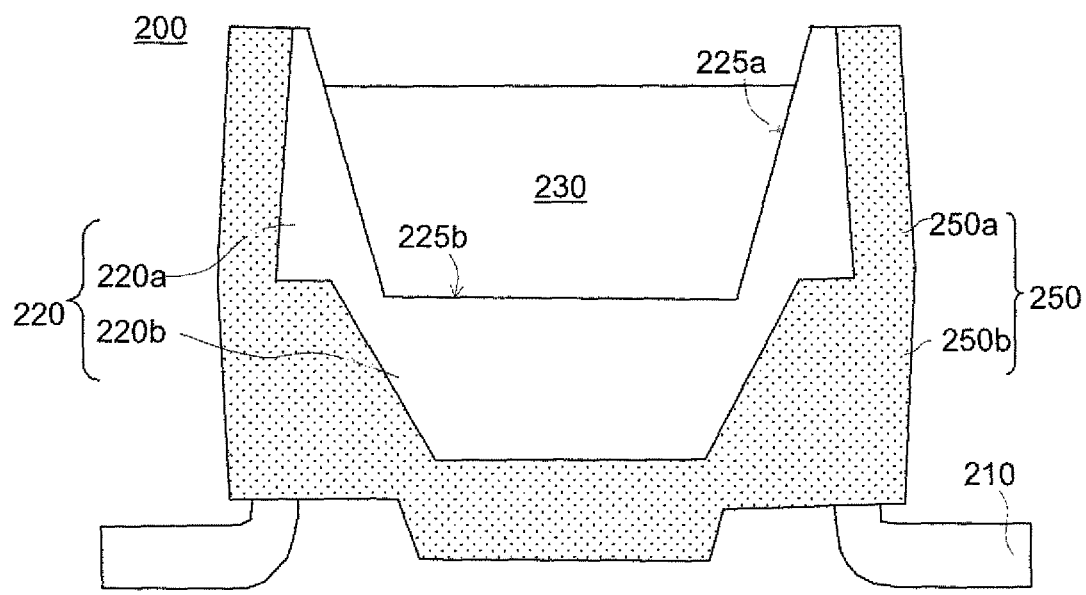
FIG. 2E illustrates a cross-sectional view of the light-emitting device shown in FIG. 2A taken along line 3-3.
Figure 2F:
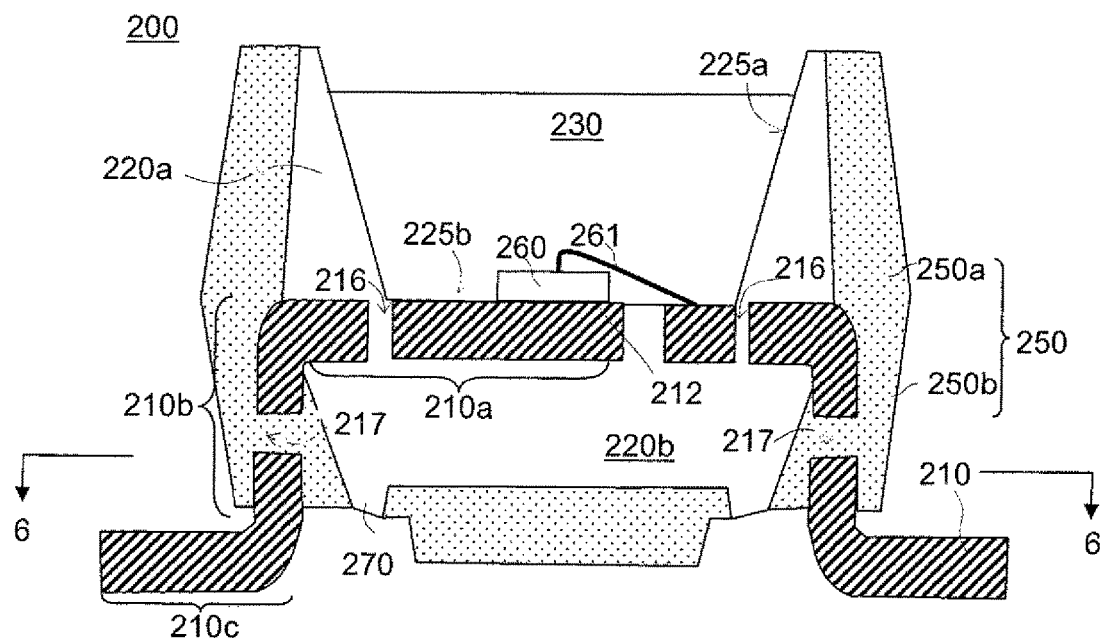
FIG. 2F illustrates a cross-sectional view of the light-emitting device shown in FIG. 2A taken along line 4-4.
Figure 2G:
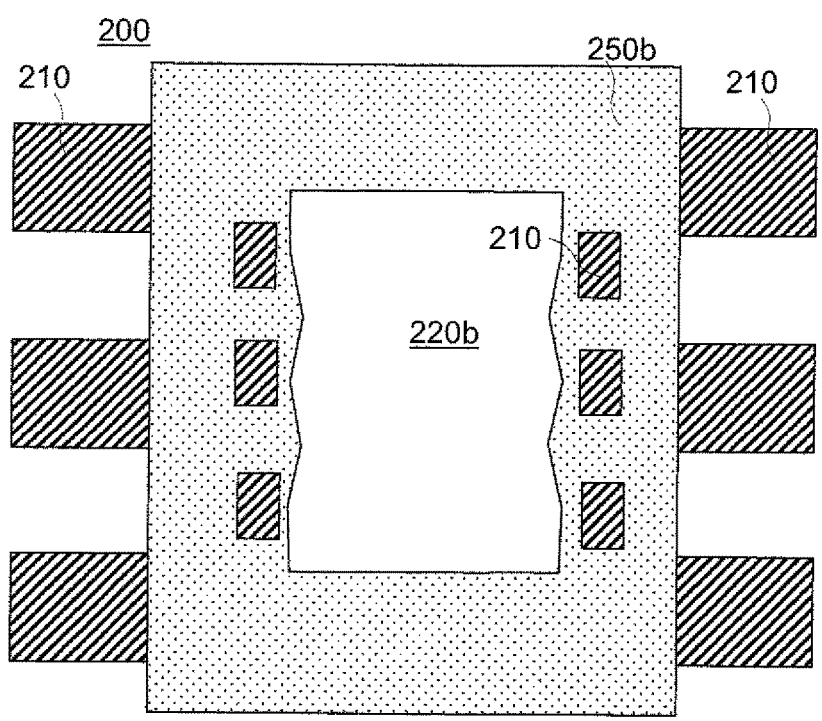
FIG. 2G illustrates a cross-sectional view of the light-emitting device shown in FIG. 2F taken along line 6-6.

In addition to the interlock apertures 216-217 of the leads 210, other interlocking mechanism, such as mechanical interlock between the inner reflective body 220 and the outer non-reflective body 250 can be obtained by adapting a specific geometry or shape such that the bodies 220 and 250 are mechanically interlocking each other. Such specific geometry or shape is referred hereinafter as interlock geometry. An example of the interlock geometry is illustrated by comparing the cross sectional views at cross-sectional lines 2-2, 3-3 and 4-4 of the light-emitting device 200 shown in FIG. 2D, FIG. 2E and FIG. 2F respectively. In the embodiment shown in FIGS. 2D-2F, the cross-sectional view taken along line 4-4 is substantially similar or identical to the cross-sectional view taken along line 2-2. As shown in FIGS. 2D, 2E and 2F, the overall shape of the light-emitting device 200 is substantially consistent but bottom portion 220b of the inner reflective body 220 is slightly larger at location along sectional lines 2-2 and 4-4 compared to the inner reflective body 220 along sectional line 3-3. Alternatively, the outer non-reflective body 250 may be larger along sectional line 3-3 but smaller along sectional line 2-2 and 4-4 accommodating the shape of the inner reflective body 220. This is illustrated by FIG. 2G illustrating a cross-sectional view taken along line 6-6 shown in FIG. 2F.

As shown in FIG. 2G, the inner reflective body 220 defines a shape having at least two sides with depressions that enable mechanical interlocking between the inner reflective body 220b and the outer non-reflective body 250b. Another way to provide mechanical interlocking may be through protrusions such as the interlock structure 270 shown in FIG. 2D. While the interlock geometry relies on the overall shape for mechanical interlocking, the interlock structure 270 is usually a structure such as a protrusion configured to provide mechanical interlocking between the inner reflective body 220 and the outer non-reflective body 250. By utilizing one or more interlocking mechanisms such as the interlock apertures 216-217, the interlock structures 270, and the interlock geometry either individually or in any combination, reliability performance of the light-emitting device 200 can be improved.

In the embodiment shown in FIG. 2F, the interlock structures 270 and the interlock geometry are located at the bottom portion 220b that is less sensitive to the optical performance of the light-emitting device 200. The top portion 220a of the inner reflective body 220 that defines the reflector 225 may be potentially more sensitive to optical performance. Examples of such optical performance are viewing angle and light uniformity. In order to obtain consistent optical performance, the reflector 225 may be consistent in shape so that the optical performance of the light-emitting device 200 is not affected. For example, the cross-sectional view of the light-emitting device 200 in FIG. 2H taken along sectional line 5-5 shows one consistent shape as illustrated by the bottom reflective surface 225b defining a substantially rectangular shape. However, the interlocking mechanism such as interlock structures 270, interlock geometries can be located at the upper portion 220a of the inner reflective body 220.

Figure 2H:
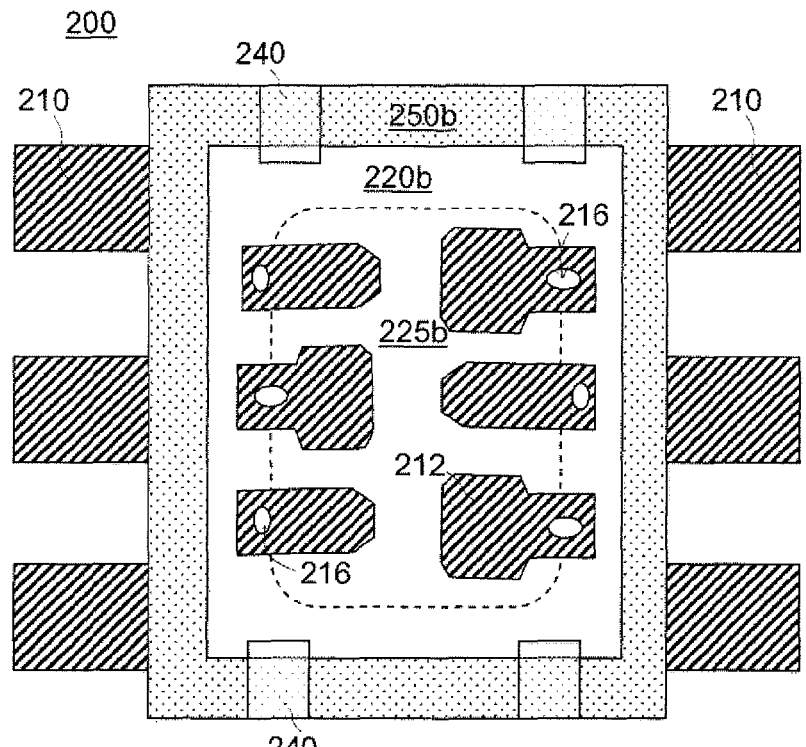
FIG. 2H illustrates a cross-sectional view of the light-emitting device shown in FIG. 2A taken along line 5-5.
Figure 3:
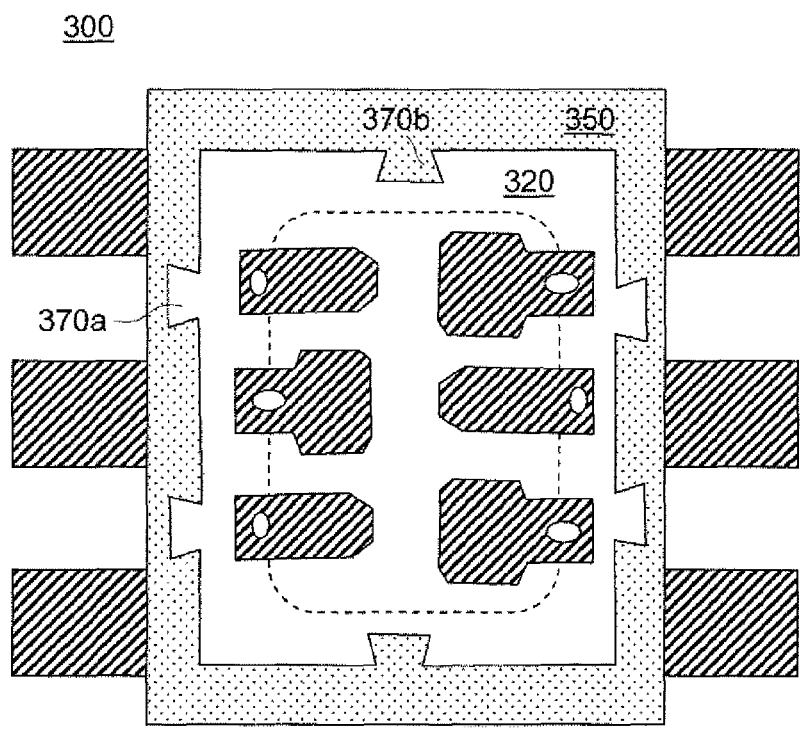
FIG. 3 illustrates a cross-sectional view of an alternative light-emitting device having interlock structures.

FIG. 3 illustrates a cross-sectional view of an alternative embodiment of a light-emitting device 300, which is substantially similar to the light-emitting device 200 shown in FIG. 2H. The light-emitting device 300 is similar to the light-emitting device 200 in many aspects but differs at least in that the light-emitting device 300 further comprises a number of interlock structures such as interlock structures 370a and 370b defined by the inner reflective body 320 and the outer non-reflective body 350 respectively along the sides of the light-emitting device 300. The interlock structures 370a and 370b provide further mechanical interlock between the two bodies 320 and 350. In the embodiment shown in FIG. 3, the interlock structure 370a defines a protrusion whereas the interlock structure 370b is an aperture adapted to accommodate the protrusion. This arrangement can be reversed. The interlocking mechanism illustrated in various embodiments such as the interlock apertures 216-217 in FIG. 2D, the interlock geometry shown by FIG. 2D and FIG. 2E, the interlock structures 270 shown in FIG. 2D, as well as the interlock structures 370a and 370b shown in FIG. 3 may be used in any combination or separately. However, one advantage of having more such interlocking mechanisms is the general increase in reliability of the light-emitting device.

Figure 4:
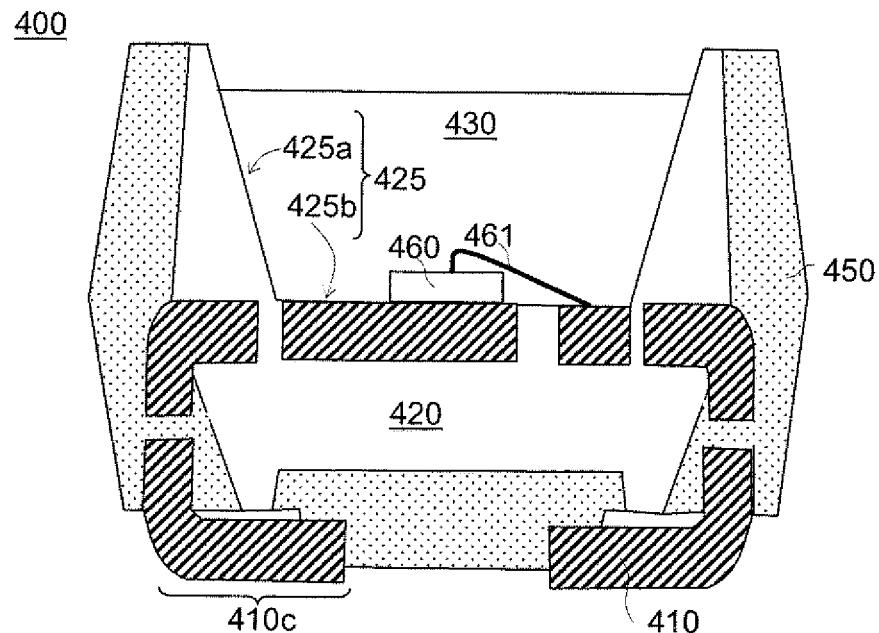
FIG. 4 illustrates a cross-sectional view of an alternative light-emitting device having inwardly bent leads.

FIG. 4 illustrates a cross-sectional view of an alternative embodiment of a light-emitting device 400. The light-emitting device 400 comprises a plurality of leads 410, an inner reflective body 420, an outer non-reflective body 450, a light source die 460, and a wire bond 461 connecting the light source die 460 to the leads 410. The inner reflective body 420 and the outer non-reflective body are formed by first and second encapsulant. The die 460 and the wire bond 461 are encapsulated by a third encapsulant which is usually made transparent or semi-transparent. The inner reflective body 420 defines a reflector 425 comprising an inner reflective surface 425a and a bottom reflective surface 425b. The light-emitting device 400 is substantially similar to the light-emitting device 200 shown in FIG. 2D but differs at least in that the leads 410 are bent inwardly instead of outwardly shown in FIG. 2D.

Unlike the light-emitting device 200 in which the bottom horizontal section 210c is located away from the outer non-reflective body 250, the bottom horizontal section 410c of the light-emitting device 400 is hidden beneath the outer non-reflective body 450. While the outwardly bent leads 210 shown in FIG. 2D may reflect light falling on the leads 210, the inwardly bent leads 410 shown in FIG. 4 may be prevented from reflecting ambient light. In addition, the inwardly bent leads 410 require less space on a printed circuit board (referred hereinafter as "PCB") compared to the light-emitting device 200 shown in FIG. 2.

Figure 5:
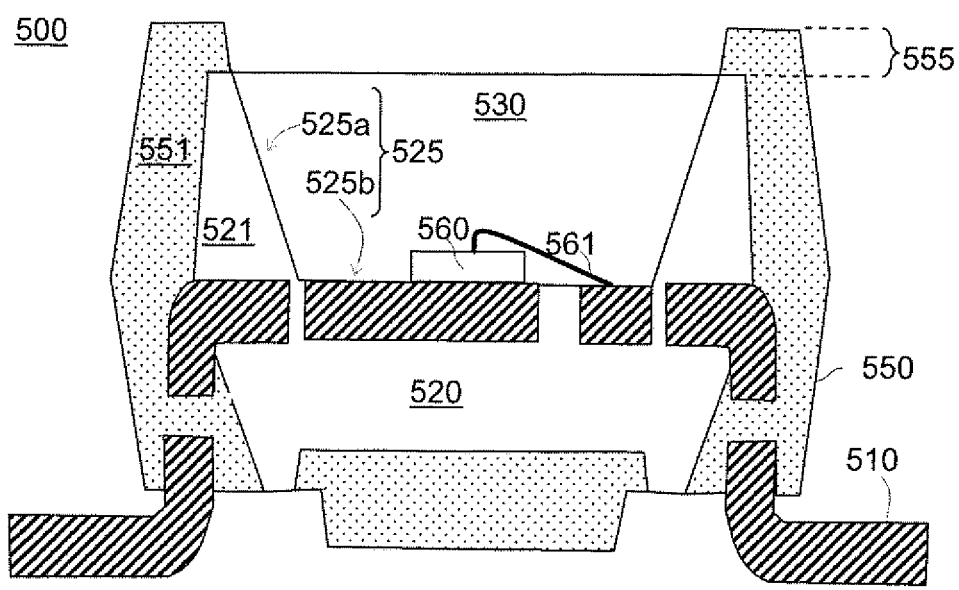
FIG. 5 illustrates a cross-sectional view of an alternative light-emitting device with an outer non-reflective body enclosing all external surfaces of an inner reflective surface.

FIG. 5 illustrates a cross-sectional view of an alternative embodiment of a light-emitting device 500. The light-emitting device 500 comprises a plurality of leads 510, an inner reflective body 520, an outer non-reflective body 550, a light source die 560, a wire bond 561 connecting the light source die 560 to the leads 510, and an encapsulant 530 encapsulating the die 560. The inner reflective body 520 defines a reflector 525 comprising an outer surface 521, an inner reflective surface 525a and a bottom reflective surface 525b. The light-emitting device 500 is substantially similar to the light-emitting device 200 shown in FIG. 2D but differs at least in that external surface of the reflector 525 may be entirely enclosed by the outer non-reflective body 550.

As shown in FIG. 5, other than the inner reflective surface 525a and the bottom reflective surface 525b, the outer non-reflective body 550 may entirely enclose the inner reflective body 520. The outer non-reflective body 550 defines an outer wall 551 surrounding the outer surface 521 of the inner reflective body 520. The outer wall 551 further comprises a portion 555 extending over and above the inner reflective body 520 to entirely enclose the outer surface 521 of the inner reflective surface 520. Consequently, the outer surface 521 of the inner reflective body 520 is not visible from outside the light-emitting device 500.

Figure 6A:
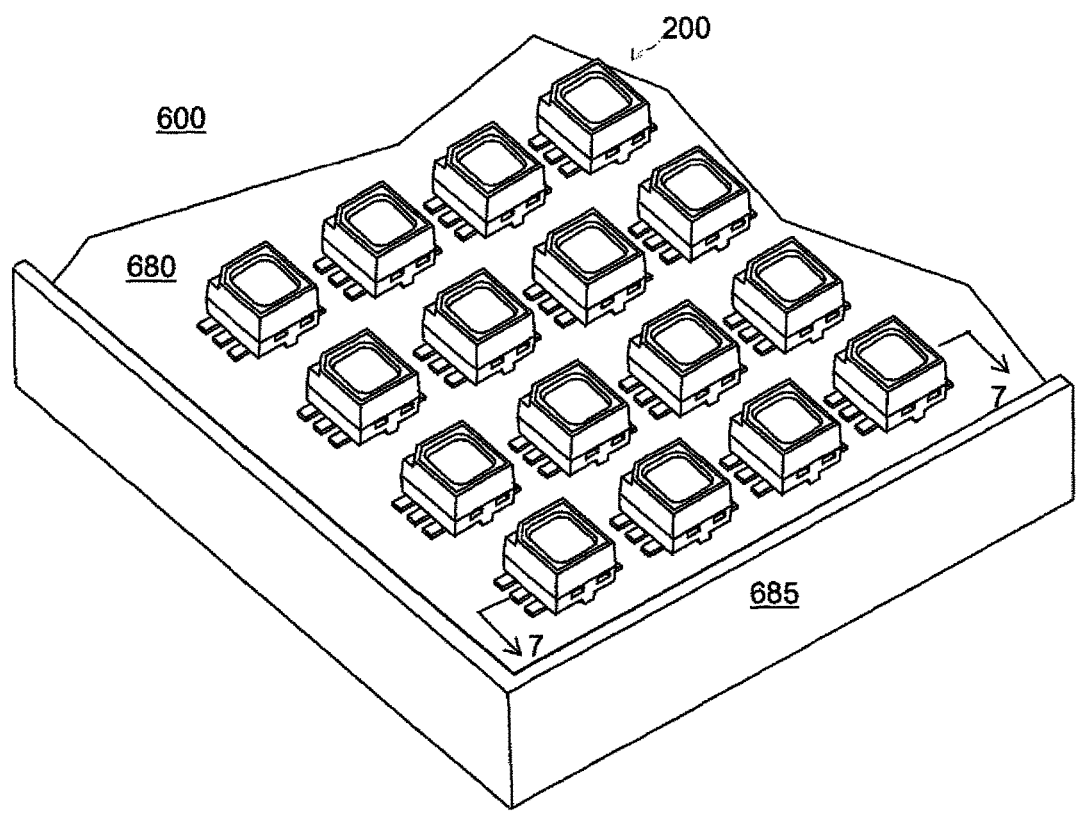
FIG. 6A illustrates a cut-away perspective view of an electronic infotainment display system.
Figure 6B:
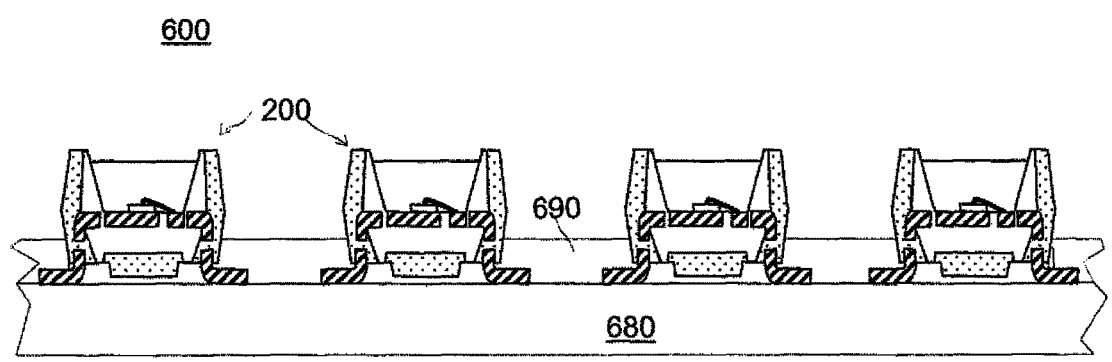
FIG. 6B illustrates a cross-sectional view of the electronic infotainment display system shown in FIG. 6A taken along line 7-7.

FIG. 6A illustrates a cut-away perspective view of an electronic infotainment display system 600. The electronic infotainment display systems 600 may be commonly found in stadiums, discotheques, electronic traffic sign displays and infotainment boards on streets. FIG. 6B illustrates a cross-sectional view of the electronic infotainment display system 600 taken along line 7-7. The electronic infotainment display system 600 comprises a substrate 680, a body 685 and a plurality of light-emitting devices such as light-emitting devices 200, 300, 400 and 500 as shown in FIG. 2A and other embodiments such as in FIGS. 3, 4 and 5.

The light-emitting devices 200 is preferably arranged in an array having multiple columns and rows. In the embodiment shown in FIG. 6A, each of the light-emitting devices 200 may represent a pixel of the electronic infotainment display system 600. For a color display system, the light-emitting devices 200 may have at least three light source dies 260 shown in FIG. 2D. Each light source die 260 may be capable of emitting red, green or blue light, respectively. Alternatively, in another embodiment, three neighboring light-emitting devices, each capable of emitting a single color may collectively represent a pixel. Yet in another embodiment where the infotainment display system 600 is a mono color display, each light-emitting device may comprise a single color light source die 260 representing a pixel in the display.

As shown in FIGS. 6A-6B, the light-emitting devices 200 is attached to the substrate 680, usually a PCB. The light-emitting devices 200 may be soldered or otherwise attached, as known in the art to the PCB. As the electronic infotainment display system 600 may be used in outdoor conditions exposed to extreme weather conditions, such as rain, snow, hail, heat, cold, wind, and direct sun light, the substrate 680 and all the electronics components including the light-emitting devices 200 may require protection from the elements of nature. This can be accomplished by utilizing a silicone potting process.

The silicone potting process utilizes a potting agent 690 to encapsulate electronic devices, including the light-emitting devices 200 and the substrate 680. The potting agent 690 may include pourable insulating resins, such as epoxies, silicones, urethanes, hybrids, or any other similar material. The potting agent 690 may be cast into cavities containing electronic components to insulate, protect, and hold them in place. The potting agent 690 thus helps to protect the electronic components from moisture, as well as mechanical stresses, such as shock and vibration. In order to prevent the leads 210 of the light-emitting device 200 from reflecting light, the potting agent 690 is preferably dark colored, low gloss, or both. The infotainment display shown in FIG. 6A-6B have an improved contrast as the reflectivity of ambient light or any other light falling on the display is low. All high reflective components such as the inner reflective body and the leads can be hidden or concealed.

Other than the infotainment display system, the light-emitting devices 200, 300, 400 and 500 shown in FIG. 2A and FIGS. 3-5 may be used in other applications such as indicator lights in home electrical appliances. Due to the high reliability performance, the light-emitting devices 200, 300, 400 and 500 may be suitable for automotive applications. The light-emitting devices 200, 300, 400 and 500 used in the infotainment display system may be suitable to be used in applications, such as flashlights, due to the high output capability. Usually the production yield for light-emitting devices for infotainment display system may be low due to the color and brightness binning requirements. Finding other applications for the same light-emitting devices that do not require tight binning requirements can increase the production yield substantially.

Figure 7:
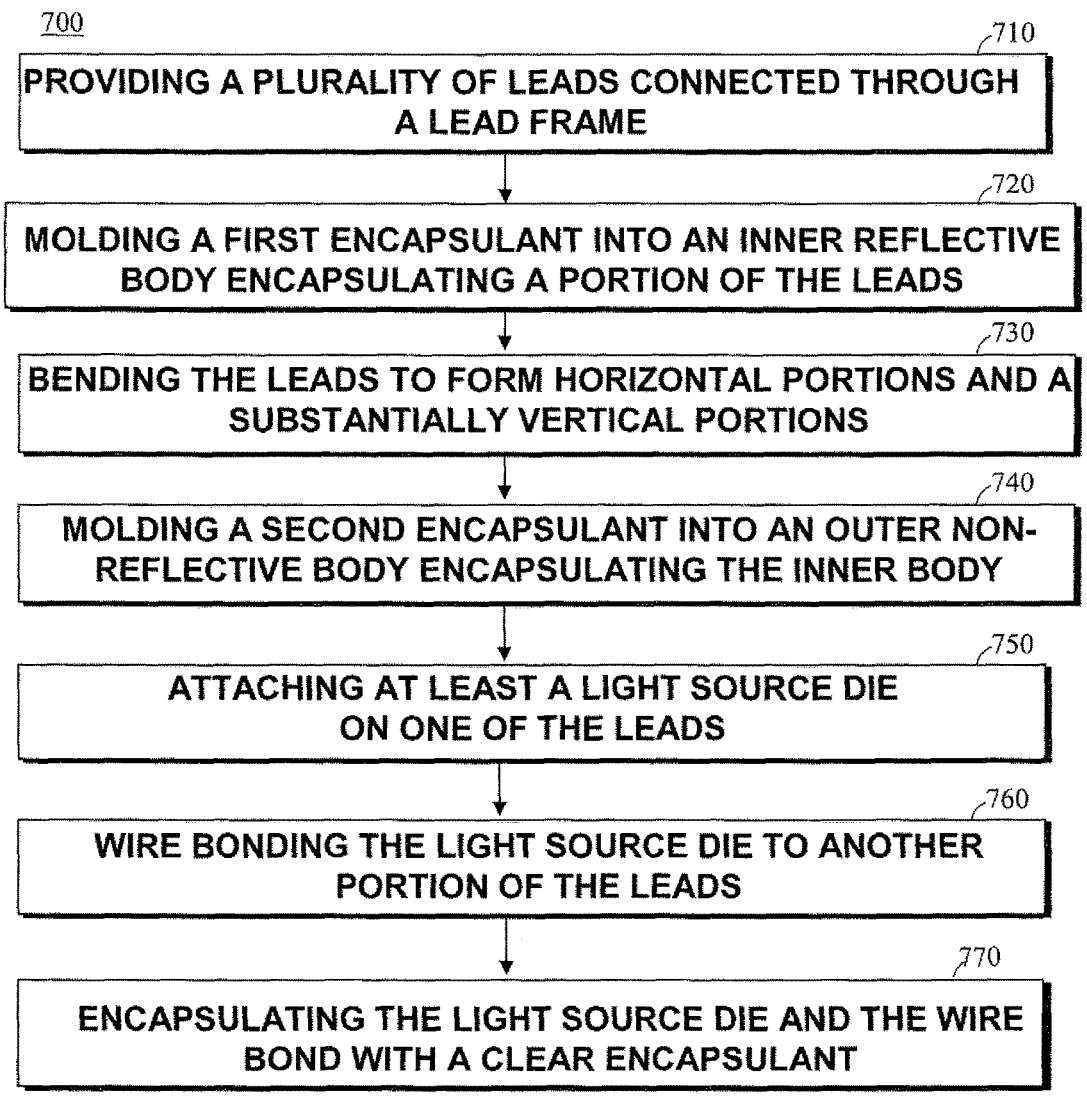
FIG. 7 illustrates a method for manufacturing the light-emitting device shown in FIG. 2A.

FIG. 7 shows a flow chart illustrating a method of manufacturing the light-emitting devices such as the light-emitting device 200 shown in FIG. 2. In step 710, a plurality of leads connected through a lead frame is provided. In step 720, an inner reflective body is formed by molding a first encapsulant into the required shape and cured into solid form. The first encapsulant encapsulates a first portion of the leads. The first encapsulant is a material that has high reflectivity. A portion of the inner reflective body defines a reflector comprising an inner reflective surface and a bottom surface. The method then proceeds to step 730 in which the leads are cut and bent at an angle to define the leads into substantially horizontal portions and substantially vertical portions. The angle may be substantially 90 degrees. The inner reflective body may be held on the lead frame through an aperture located at the side of the body.

In step 740, a second encapsulant is molded into an outer non-reflective body that encapsulates a substantial portion of the inner reflective body and a second portion of the leads. Material for the second encapsulant is preferably non-reflective and preferably capable of absorbing light falling on the surface of the outer non-reflective body. Similarly, the second encapsulant is cured into solid form before proceeding to the next step.

In step 750 at least a light source die is attached onto one of the leads. Next, in step 760, the light source die is wire bonded to another portion of the leads. The wire bonds may be configured to provide electrical connection to the light source die. In step 770, the light source die, the wire bond, the bottom reflective surface and the inner reflective surface may be encapsulated by a third encapsulant such as silicone and clear epoxy. For surface mount light-emitting devices such as those shown in FIG. 2, the leads are bent again to define the bottom horizontal portions. Finally, the light-emitting device is separated from the lead frame. This may be done by cutting off the portion of the lead frame connected to the inner reflective body or withdrawing the portion of the lead frame inside the aperture. In another embodiment, the sequence of the steps may be altered. For example, die attach and wire bond described in step 750 and 760 may be done first prior to molding the inner reflective body described in step 720.

Although specific embodiments of the invention have been described and illustrated herein above, the invention should not be limited to any specific forms or arrangements of parts so described and illustrated. For example, light source die described above may be LEDs die or some other future light source die. Likewise, although a light-emitting device with three die and six leads was discussed, the light-emitting device may contain any number of die or leads, as known or later developed without departing from the spirit of the invention. The scope of the invention is to be defined by the claims appended hereto and their equivalents. Similarly, manufacturing embodiments and the steps thereof may be altered, combined, reordered, or other such modification as is known in the art to produce the results illustrated.

What is claimed is:

1. A light source packaging, comprising:
   a plurality of leads;
   at least one light source die attached on one of the plurality of leads;
   a first encapsulant encapsulating a first portion of the leads defining an inner reflective body, wherein the first encapsulant consists of an inner reflective surface, a bottom reflective portion and an outer reflective surface, and encapsulates the first portion of the leads in the bottom reflective portion;
   a reflector defined by at least the inner reflective surface;
   second encapsulant encapsulating substantially a second portion of the leads and the outer reflective surface surrounding the reflector of the inner reflective body defining an outer non-reflective body; and
   a third encapsulant encapsulating the light source die and the inner reflective surface in a way that a top surface of the third encapsulant is below a top surface of the inner reflective body.

2. The packaging of claim 1, wherein the inner reflective body comprises a first interlock structure, and wherein the outer non-reflective body comprises a second interlock structure mating the first interlock structure.

3. The packaging of claim 1, wherein the outer non-reflective body extends over and above the inner reflective body such that the outer surface is covered entirely by the outer non-reflective body.

4. The packaging of claim 1, wherein the inner reflective body defines an interlock geometry having a larger portion and a smaller portion at intervals accommodating the shape of the outer non-reflective body configured to provide mechanical interlock between the inner reflective body and the outer non-reflective body.

5. The packaging of claim 1, wherein the light-source packaging forms a portion of an electronic infotainment display system.

6. The packaging of claim 1, wherein at least one of the leads comprise a first interlock aperture to provide mechanical interlock between the inner reflective body and the leads.

7. The packaging of claim 6, wherein the first interlock aperture is located on the inner reflective surface.

8. The packaging of claim 6, wherein at least one of the leads comprise a second interlock aperture to provide mechanical interlock between the outer non reflective body and the leads.

9. The packaging of claim 8, wherein each lead is bended at least once to define a side portion that comprises the second interlock aperture.

10. A light-emitting device, comprising:
a plurality of leads, the leads being bent such that each lead comprises a substantially horizontal portion and a substantially vertical portion;
a light source die attached to one of the plurality of leads;
an inner reflective body having an inner reflective surface, a bottom reflective portion and an outer reflective surface, the inner reflective body being a first encapsulant encapsulating the substantially horizontal portion of the leads in the bottom reflective portion;
a reflector defined by the inner reflective surface and the bottom reflective surface;
an outer non-reflective body formed from a second encapsulant encapsulating substantially at least the substantially vertical portion of the leads and the outer reflective surface surrounding the reflector of the inner reflective body; and
a third encapsulant encapsulating the light source die, the inner reflective surface, and the bottom reflective surface in a way that a top surface of the third encapsulant is below a top surface of the inner reflective body.

11. The light-emitting device of claim 10, wherein the inner reflective body defines an interlock geometry configured to provide mechanical interlock between the inner reflective body and the outer non-reflective body.

12. The light-emitting device of claim 10, wherein the inner reflective body comprises a first interlock structure, and the outer non-reflective body comprises a second interlock structure mating the first interlock structure.

13. The light-emitting device of claim 10, wherein the outer non-reflective body extends above and over the inner reflective body to enclose the inner reflective body entirely such that only the bottom reflective surface and the inner reflective surface of the inner reflective body is visible externally.

14. The light-emitting device of claim 10, wherein the outer non-reflective body comprises an aperture for holding a lead frame during the manufacturing process, and the aperture extends through the outer non-reflective body towards the inner reflective body.

15. The light-emitting device of claim 10, wherein the light-emitting device forms a portion of an electronic infotainment display system.

16. The light-emitting device of claim 10, wherein at least two lead of the plurality of leads are formed in the same shape with each other.

17. The light-emitting device of claim 10, wherein at least one of the leads comprise a first interlock aperture to provide mechanical interlock between the inner reflective body and the leads.

18. The light-emitting device of claim 17, wherein the first interlock aperture is formed on the substantially horizontal portion of the leads.

19. The light-emitting device of claim 17, wherein at least one of the leads comprise a second interlock aperture to provide mechanical interlock between the outer non-reflective body and the leads.

20. The light-emitting device of claim 19, wherein the second interlock aperture is formed on the substantially vertical portion of the leads.

* * * * *